(12) United States Patent
Iwasaki

(10) Patent No.: US 7,646,239 B2
(45) Date of Patent: Jan. 12, 2010

(54) FEED-FORWARD AMPLIFIER

(75) Inventor: Takashi Iwasaki, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 53 days.

(21) Appl. No.: 12/000,003

(22) Filed: Dec. 6, 2007

(65) Prior Publication Data

US 2008/0136518 A1    Jun. 12, 2008

(30) Foreign Application Priority Data

Dec. 7, 2006    (JP)    ............... 2006-330298

(51) Int. Cl.
*H03F 3/66*    (2006.01)
(52) U.S. Cl. .................. 330/151; 330/52; 330/289
(58) Field of Classification Search .......... 330/52, 330/151
See application file for complete search history.

(56) References Cited

U.S. PATENT DOCUMENTS

| | | | | |
|---|---|---|---|---|
| 5,999,047 A | * | 12/1999 | Zhang et al. | 330/149 |
| 6,011,434 A | * | 1/2000 | Sakai | 330/151 |
| 6,163,210 A | * | 12/2000 | Fukuchi | 330/52 |
| 6,232,838 B1 | * | 5/2001 | Sugimoto | 330/151 |
| 6,774,716 B2 | * | 8/2004 | Suto | 330/52 |

FOREIGN PATENT DOCUMENTS

| | | |
|---|---|---|
| JP | 01-200807 | 8/1989 |
| JP | 10-284951 | 10/1998 |
| JP | 2000-138539 | 5/2000 |
| JP | 2001-053552 | 2/2001 |
| JP | 2003-092517 | 3/2003 |

OTHER PUBLICATIONS

Japanese Office Action dated Dec. 4, 2008.

* cited by examiner

*Primary Examiner*—Steven J Mottola
(74) *Attorney, Agent, or Firm*—Jacobson Holman PLLC

(57) ABSTRACT

There is provided a feed-forward amplifier which enables a predistortion circuit to obtain sufficient distortion compensation effects even if ambient temperature or the like changes. The feed-forward amplifier includes a variable attenuator for controlling the amount of attenuation of a signal input to a main amplifier, a variable attenuator for controlling the amount of attenuation to prevent deterioration of distortion compensation due to a change in the ambient temperature of the main amplifier, a variable attenuator for controlling the amount of attenuation of a signal input to an auxiliary amplifier, and a variable attenuator for controlling the amount of attenuation to prevent deterioration of distortion compensation due to a change in the ambient temperature of the auxiliary amplifier, wherein a control circuit controls the variable attenuators to reduce the amount of attenuation according to the reduced gain of the main amplifier and the reduced gain of the auxiliary amplifier, and a control circuit controls the variable attenuators to optimize the amount of attenuation according to the ambient temperature of the main amplifier and the ambient temperature of the auxiliary amplifier.

4 Claims, 8 Drawing Sheets

FEED-FORWARD AMPLIFIER

BACKGROUND OF THE INVENTION

1. Field of the Invention

The present invention relates to a feed-forward amplifier having a predistortion circuit (predistortion compensator), and particularly to a feed-forward amplifier that enables the predistortion circuit to obtain distortion compensation effects even if ambient temperature or the like changes.

2. Description of the Related Art

Recently, various developments have been made for feed-forward amplifiers.

When a feed-forward amplifier amplifies a modulation wave signal having in general a high peak-to-average power ratio, if the back-off of the amplifier is decreased to increase efficiency, linearity is deteriorated and hence large distortion occurs. On the contrary, if the back-off is increased to improve linearity, efficiency is reduced.

For example, there is a feed-forward amplifier shown in FIG. 2 as a method of compensating non-linear distortion caused by small back-off. FIG. 2 is a circuit block diagram of a feed-forward amplifier according to a first prior art (prior art 1).

As shown in FIG. 2, in the feed-forward amplifier of the prior art 1, a signal input from an input terminal 1 is divided by a divider 2. One divided signal passes through a variable attenuator 4 and a variable phase-shifter 5. Then, a pilot signal generated from a pilot signal generator 16 is inserted into the signal, and input to a main amplifier 6. The variable attenuator 4 and the variable phase-shifter 5 are controlled by a control circuit 19.

On the other hand, the other signal divided by the divider 2 is delayed through a delay line 10 and input to a combiner 11.

The output of the main amplifier 6 is input to a divider 7. One divided signal is input to a combiner 9 through a delay line 8 and the other divided signal is input to the combiner 11.

The combiner 11 combines the signal that has passed through the delay line 10 with the output of the divider 7. The output of the combiner 11 passes through a variable attenuator 12 and a variable phase-shifter 13 and is input to an auxiliary amplifier 14. The variable attenuator 12 and the variable phase-shifter 13 are controlled by the control circuit 19.

The output of the auxiliary amplifier 14 is combined by the combiner 9 with the signal that has passed through a delay line 8, and output from an output terminal 15.

A carrier component is detected by a carrier detector 17 at an output point of the combiner 11, and this detected carrier level is input to the control circuit 19. Further, a pilot signal level inserted by a pilot signal detector 18 is detected at an output point of the combiner 9 and input to the control circuit 19.

Next, the operation of the feed-forward amplifier of the prior art 1 will be described.

The signal input from the input terminal 1 is divided by the divider 2, and the divided signals are output to one signal path and the other signal path, respectively. The signals that have passed through one signal path and the other signal path are combined by the combiner 11, and a carrier component of the combined output is detected by the carrier detector 17 and input to the control circuit 19.

The control circuit 19 controls the variable attenuator 4 and the variable phase-shifter 5 in such a manner to minimize the output of the carrier detector 17. Since control is thus performed, one signal path and the other signal path exhibit the same amplitude but opposite phase so that only the distortion component of the main amplifier 6 is extracted from the output of the combiner 11.

Further, the distortion component extracted by the combiner 11 passes through the variable attenuator 12 and the variable phase-shifter 13, and after amplified by the auxiliary amplifier 14, it is combined by the combiner 9 with the signal that has passed through the delay line 8. A pilot signal component contained in the output of the combiner 9 is detected by the pilot detector 18 and input to the control circuit 19.

The control circuit 19 controls the variable attenuator 12 and the variable phase-shifter 13 in such a manner to minimize the output of the pilot detector 18. Since control is thus performed, the one signal path and the other signal path divided by the divider 7 exhibit the same amplitude but opposite phase so that the distortion generated by the main amplifier 6 can be cancelled out.

However, in the feed-forward amplifier shown in FIG. 2, the amount of compensation needs to be increased to assure an equivalent distortion amount in the feed-forward amplifier as the amount of distortion generated by the main amplifier 6 increases.

In this case, although the auxiliary amplifier 14 needs to be replaced with an amplifier having high output power to improve the linearity of the auxiliary amplifier 14, the efficiency of the feed-forward amplifier is reduced.

Even if the main amplifier 6 is replaced with an amplifier having high output power to reduce the amount of distortion generated by the main amplifier 6, the efficiency of the feed-forward amplifier is also reduced.

On the other hand, there is also known a method of providing a predistortion circuit on the input side of the main amplifier 6 to correct AM-AM characteristics and AM-PM characteristics of the amplifier in order to reduce the distortion of the amplifier with the same back-off.

An example of the feed-forward amplifier including a predistortion circuit is disclosed in Japanese Patent No. 2047120. FIG. 3 shows a block diagram thereof. FIG. 3 is a circuit block diagram of a feed-forward amplifier according to a second prior art (prior art 2).

As shown in FIG. 3, the feed-forward amplifier of the prior art 2 has a distortion detection loop 100 for detecting a distortion component of a main amplifier 106 and a distortion removing loop 200 for inserting the detected distortion component into an output signal path 114 of the main amplifier 106 to remove the detected distortion component.

In the distortion detection loop 100, a predistortion circuit (predistortion compensator) 120A is provided on the input side of the main amplifier 106 to improve the distortion of this main amplifier 106, while a variable attenuator 108 or the like for control of the distortion detection loop 100 is included in a variable delay line 109.

The following describes the operation of the feed-forward amplifier of the prior art 2.

A signal input from an input terminal 101 is divided by a power divider 103. One divided signal passes through the predistortion circuit 120A and the main amplifier 106, and is input to a power combiner 104.

On the other hand, the other output of the power divider 103 passes through the variable attenuator 108 and the variable delay line 109, and is input to the power combiner 104 and combined with the output of the main amplifier 106. The same component as that from the main amplifier 106 is supplied from the power combiner 104 into the output signal path 114 of the main amplifier 106, and the distortion component of the main amplifier 106 detected in the distortion detection loop 100 is output to a distortion insertion path 115.

The signal in the distortion insertion path 115 passes through a variable attenuator 110 and a variable delay line 111, and after amplified by an auxiliary amplifier 107, it is combined by a power combiner 105 with the signal sent from the main amplifier 106 through the output signal path 114. The output of the power combiner 105 is output from an output terminal 102.

Further, FIG. 4 shows another example of a feed-forward amplifier circuit according to another prior art (prior art 3) disclosed in Japanese Patent No. 2047120. In FIG. 4, portions equivalent to those in FIG. 3 are given the same reference numerals.

In the example of the prior art 3, the distortion insertion path 115 passes through the variable attenuator 110, the variable delay line 111, and a predistortion circuit 120B and is input to the auxiliary amplifier 107.

The predistortion circuit 120B is provided to improve the distortion of this auxiliary amplifier 107. The other portions are the same as those in FIG. 3.

There are the following problems in the prior arts (prior arts 2, 3) shown in FIGS. 3 and 4.

The first problem is that if the gain of the main amplifier 106 varies due to a change in ambient temperature or the like, the amount of distortion generated by the main amplifier 106 varies due to a change in output level. In this case, since the amount of distortion compensation in the predistortion circuit 120A is constant, the distortion of the main amplifier 106 cannot be compensated.

In the feed-forward amplifier circuit, when the gain of the main amplifier 106 varies due to a change in ambient temperature, the variable attenuator 108 inserted in a linear signal path 113 generally needs to be adjusted in such a manner that a signal path 112 of the main amplifier 106 and the linear signal path 113 will exhibit the same gain but opposite phase in order to perform distortion extraction correctly. However, in the feed-forward amplifier circuits shown in FIGS. 3 and 4, since the variable attenuator 108 is inserted in the linear signal path 113, the output level of the main amplifier 106 remains varying.

The second problem is that if the gain of the auxiliary amplifier 107 varies due to a change in ambient temperature or the like, the amount of compensation of the predistortion circuit 120B varies so that the distortion of the auxiliary amplifier 107 cannot be compensated.

In the feed-forward amplifier circuit, when the gain of the auxiliary amplifier 107 varies due to a change in ambient temperature, the variable attenuator 110 generally needs to be controlled in such a manner that the output signal path 114 of the main amplifier 106 and the distortion insertion path 115 will exhibit the same gain but opposite phase in order to remove the distortion correctly. However, in the conventional feed-forward amplifier circuits in which the variable attenuator 110 is provided prior to the predistortion circuit 120B, the input level of the predistortion circuit 120B varies to change the amount of compensation.

In order to solve such problems, still another example of a feed-forward amplifier is disclosed in Japanese Patent No. 3106996 as shown in a block diagram of FIG. 5. FIG. 5 is a circuit block diagram of the feed-forward amplifier of the prior art (prior art 4) disclosed in Japanese Patent No. 3106996.

As shown in FIG. 5, the feed-forward amplifier of the prior art 4 is such that a signal input from the input terminal 1 is divided by the divider 2 into a signal path (a) and a signal path (b). One signal output to the signal path (a) side passes through the predistortion circuit 3, the variable attenuator 4, and the variable phase-shifter 5. Then, after the pilot signal generated from the pilot signal generator 16 is inserted, the one signal is input to the main amplifier 6.

Here, the variable attenuator 4 and the variable phase-shifter 5 are controlled by the control circuit 19.

On the other hand, the output of the main amplifier 6 is input to the divider 7 in such a manner that one divided output is input to the combiner 9 via the delay line 8 and the other divided output is input to the combiner 11.

The combiner 11 combines the signal that has passed through the delay line 10 with the output of the divider 7. The output of the combiner 11 passes through the variable attenuator 12, and the variable phase-shifter 13 and is input to the auxiliary amplifier 14.

The variable attenuator 12 and the variable phase-shifter 13 are controlled by the control circuit 19.

The output of the auxiliary amplifier 14 is combined by the combiner 9 with the signal that has passed through the delay line 8, and output from the output terminal 15.

A carrier component (as a single frequency component of the signal supplied to the input terminal 1 and to be amplified) is detected by the carrier detector 17 at the output point of the combiner 11, and the detected carrier level is input to the control circuit 19.

Next, the operation of the feed-forward amplifier of the prior art 4 will be described.

The signal input from the input terminal 1 is divided by the divider 2 into the signal path (a) and the signal path (b). The signal path (a) and the signal path (b) are combined by the combiner 11. The combined output of the carrier component is detected by the carrier detector 17 and input to the control circuit 19.

The control circuit 19 controls the variable attenuator 4 and the variable phase-shifter 5 in such a manner to minimize the output of the carrier detector 17. Since control is thus performed, the signal path (a) and the signal path (b) exhibit the same amplitude but opposite phase, so that only the distortion component of the main amplifier 6 is extracted from the output of the combiner 11.

Further, a predistortion circuit 3 is used in the signal path (a) to minimize the distortion of the main amplifier 6. The distortion component extracted by the combiner 11 passes through the variable attenuator 12 and the variable phase-shifter 13, and after amplified by the auxiliary amplifier 14, it is combined by the combiner 9 with the signal that has passed through the delay line 8.

The pilot signal component contained in the output of the combiner 9 is detected by the pilot detector 18 and input to the control circuit 19. The control circuit 19 controls the variable attenuator 12 and the variable phase-shifter 13 in such a manner to minimize the output of the pilot detector 18. Since control is thus performed, a signal path (c) and a signal path (d) exhibit the same amplitude but opposite phase so that the distortion generated by the main amplifier 6 can be cancelled out.

Referring next to FIG. 6, the operation of the feed-forward amplifier of the prior art 4 shown in FIG. 5 will be described on condition that ambient temperature changes. FIG. 6 contains graphs showing the characteristics of the amplifier of the prior art 4, where FIG. 6A shows the relationship between temperature and gain, and FIG. 6B shows the relationship between temperature and distortion.

It is generally known that a power amplifier used as the main amplifier 6 reduces its gain at higher temperatures as shown in FIG. 6A as ambient temperature changes. It is also generally known that the generated distortion component depends more largely upon output power than upon ambient temperature, that is, the generated distortion component increases as the output level increases as shown in FIG. 6B.

Suppose that ambient temperature increases in the circuit shown in FIG. 5. In this case, the gain of the main amplifier 6 is reduced as shown in FIG. 6A as ambient temperature increases. In this condition, since the signal path (a) and the signal path (b) are different in amplitude, the carrier component combined by the combiner 11 is output from the combiner 11 without being totally cancelled out. The carrier component output from the combiner 11 is detected by the carrier detector 17 and input to the control circuit 19.

The control circuit 19 controls the variable attenuator 4 and the variable attenuator 5 to minimize the output of the carrier detector 17. Therefore, the amount of attenuation of the variable attenuator 4 is reduced as much as the reduced amount of gain of the main amplifier 6 so that the output of the carrier detector 17 will be minimized again. Such an operation results in keeping the output level of the main amplifier 6 constant. Further, the predistortion circuit 3 operates at a constant level irrespective of the above-mentioned operation because it is located prior to the variable attenuator 4.

Referring next to FIG. 7, another example (prior art 5) of a feed-forward amplifier disclosed in Japanese Patent No. 3106996 will be described. FIG. 7 is a circuit block diagram of the feed-forward amplifier of the prior art 5. In FIG. 7, portions equivalent to those in FIG. 5 are given the same reference numerals.

As shown in FIG. 7, a predistortion circuit 20 is provided between the combiner 11 and the variable attenuator 12 in the feed-forward amplifier of the prior art 5.

Like the circuit example shown in FIG. 5, the operation of the feed-forward amplifier of the prior art 5 shown in FIG. 7 will be described on condition that ambient temperature changes.

A power amplifier used as the auxiliary amplifier 14 also reduces its gain at higher temperatures generally as shown in FIG. 6(a) as ambient temperature changes. The generated distortion also depends more largely upon output level than upon ambient temperature, that is, the generated distortion increases as the output level increases as shown in FIG. 6(b).

Suppose that ambient temperature increases in the feed-forward amplifier of the prior art 5 shown in FIG. 7. In this case, the gain of the auxiliary amplifier 14 is reduced as shown in FIG. 6(a) as ambient temperature increases. In this condition, since the signal path (c) and the signal path (d) are different in amplitude, the pilot signal inserted and combined by the combiner 9 is output from the combiner 11 without being totally cancelled out. The pilot signal output from the combiner 9 is detected by the pilot signal detector 18 and input to the control circuit 19.

The control circuit 19 controls the variable attenuator 12 and the variable phase-shifter 13 to minimize the output of the pilot signal detector 18. Therefore, the amount of attenuation of the variable attenuator 12 is reduced as much as the reduced amount of gain of the auxiliary amplifier 14 so that the output of the pilot signal detector 18 will be minimized again. Such an operation results in keeping the output level of the auxiliary amplifier 14 constant. Further, the predistortion circuit 20 operates at a constant level irrespective of the above-mentioned operation because it is provided prior to the variable attenuator 12.

However, variations in characteristics of the conventional feed-forward amplifiers include not only variations in gain due to changes in ambient temperature as the temperature of the amplifier increases, but also variations in maximum output power thereof. In other words, the gain and hence the maximum output power are reduced as temperature increases as shown in FIG. 8. FIG. 8 is a graph showing examples of amplitude characteristics (AM-AM characteristics) with respect to the output power varying with the temperature of the amplifier. FIG. 8 shows the gain with respect to the output power varying with three kinds of temperatures.

When gain in a path from a predistortion circuit to an amplifier is made constant, the start point of gain expansion performed by the predistortion circuit dose not change because input power and gain of the predistortion circuit are constant regardless of the fact that the maximum output power of the amplifier is reduced to change the start point of gain compression. This causes a problem that the optimum point of distortion compensation of the amplifier by using the predistortion circuit can shift, and hence the optimum distortion compensation cannot be obtained.

SUMMARY OF THE INVENTION

The present invention has been made in view of the actual conditions, and it is an object thereof to provide a feed-forward amplifier which enables the predistortion circuit to obtain sufficient distortion compensation effects even if ambient temperature or the like changes.

To solve the problems in the prior arts, the present invention provides a feed-forward amplifier including a main amplifier, a predistortion compensator provided in an input path of the main amplifier, distortion detection means for detecting a distortion component of the main amplifier, and distortion removal means for inserting the distortion component detected from the output of the main amplifier to remove distortion. The feed-forward amplifier comprises: a first variable attenuator and a first variable phase-shifter provided in an input path of the predistortion compensator; a second variable attenuator provided between the predistortion compensator and the main amplifier; first temperature detection means for detecting temperature in the neighborhood of the main amplifier; first control means for controlling the first variable attenuator and the first variable phase-shifter to minimize an input signal component contained in the distortion detected by the distortion detection means; and second control means for controlling the second variable attenuator so that the predistortion compensator minimizes the distortion of the main amplifier according to the temperature detected by the first temperature detection means. This allows the first variable attenuator and the second variable attenuator to be separated and controlled independently of each other, and even if the ambient temperature of the main amplifier changes, the predistortion compensator can obtain sufficient distortion compensation effects.

The feed-forward amplifier of the present invention can also be such that the distortion removal means comprises an auxiliary amplifier for amplifying the detected distortion, a third variable attenuator provided in an input path of the auxiliary amplifier, a second variable phase-shifter, a second predistortion compensator, and a fourth variable attenuator, and the feed-forward amplifier further comprises a combiner for combining the output of the auxiliary amplifier and the output of the main amplifier, and second temperature detection means for detecting temperature in the neighborhood of the auxiliary amplifier. In this structure, the first control means controls the third variable attenuator and the second variable phase-shifter to minimize the detected distortion, and the second control means controls the fourth variable attenuator to have the second predistortion compensator minimize the distortion of the auxiliary amplifier according to the temperature detected by the second temperature detection means. This allows the third variable attenuator and the fourth variable attenuator to be separated and controlled independently of each other, and even if the ambient temperature of the auxiliary amplifier changes, the predistortion compensator can obtain sufficient distortion compensation effects.

BRIEF DESCRIPTION OF THE DRAWING

FIG. 6 contains graphs showing the characteristics of the amplifier of the prior art 4.

DESCRIPTION OF REFERENCE NUMERALS

1 . . . Input Terminal, 2 . . . Divider, 3 . . . Predistortion Circuit, 4 . . . Variable Attenuator, 5 . . . Variable Phase-Shifter, 6 . . . Main Amplifier, 7 . . . Divider, 8 . . . Delay Line, 9 . . . Combiner, 10 . . . Delay Line, 11 . . . Combiner, 12 . . . Variable Attenuator, 13 . . . Variable Phase-Shifter, 14 . . . Auxiliary Amplifier, 15 . . . Output Terminal, 16 . . . Pilot Signal Generator, 17 . . . Carrier Detector, 18 . . . Pilot Signal Detector, 19 . . . Control circuit, 20 . . . Predistortion Circuit, 21 . . . Variable Attenuator, 22 . . . Variable Attenuator, 23 . . . Control Circuit, 24 . . . Temperature Detector, 25 . . . Temperature Detector.

DESCRIPTION OF THE PREFERRED EMBODIMENT

A preferred embodiment of the present invention will be described with reference to the accompanying drawings.

The present invention is directed to a feed-forward amplifier having a predistortion circuit, where a variable attenuator for optimum control of the feed-forward amplifier and a variable attenuator for preventing deterioration of amplifier distortion compensation performed by the predistortion circuit with respect to changes in ambient temperature are separated and controlled independently of each other. This enables the predistortion circuit to obtain sufficient distortion compensation effects even if ambient temperature or the like changes.

Figure 1:
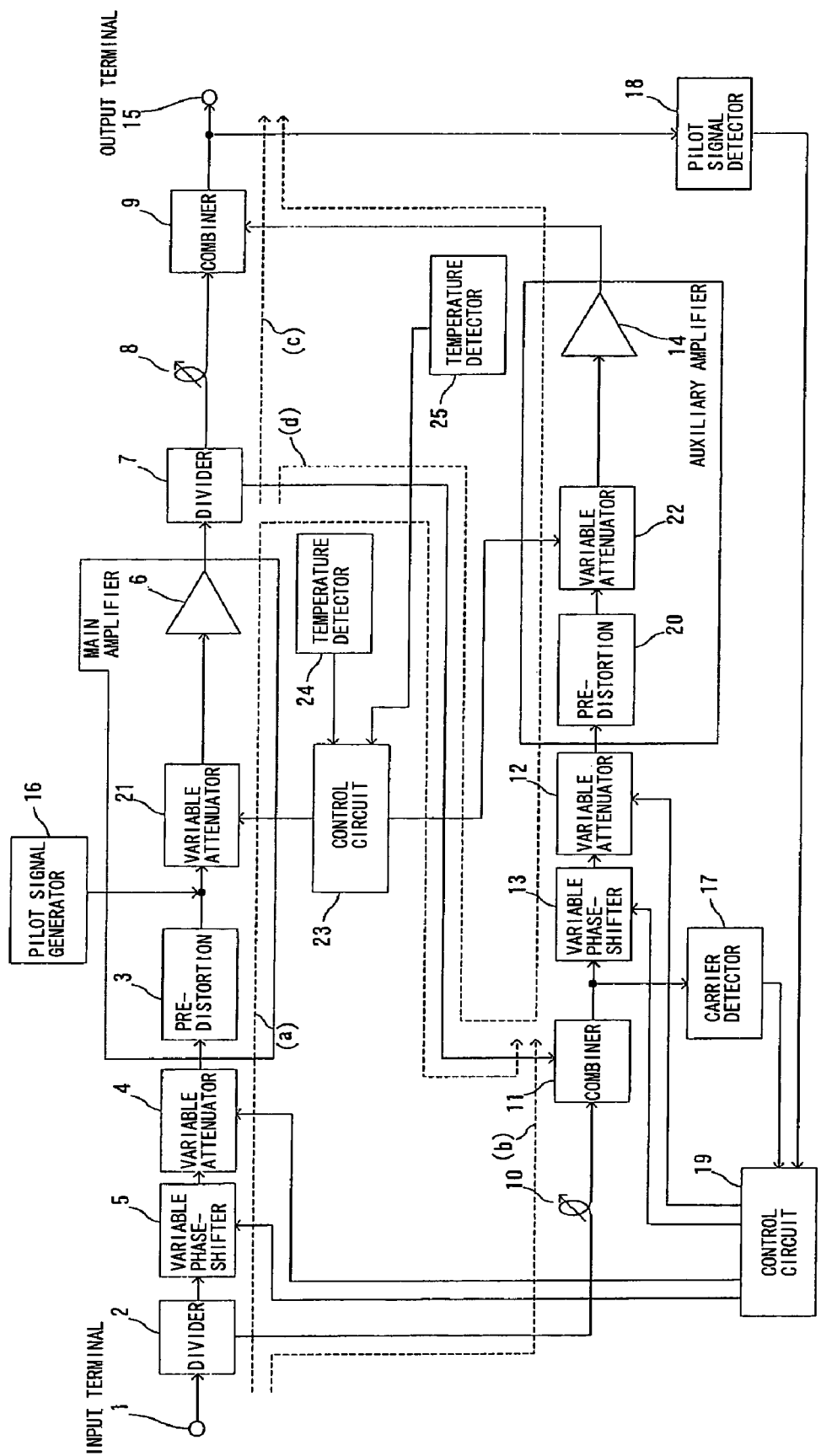
FIG. 1 is a circuit block diagram of a feed-forward amplifier according to a preferred embodiment of the present invention.
Figure 2:
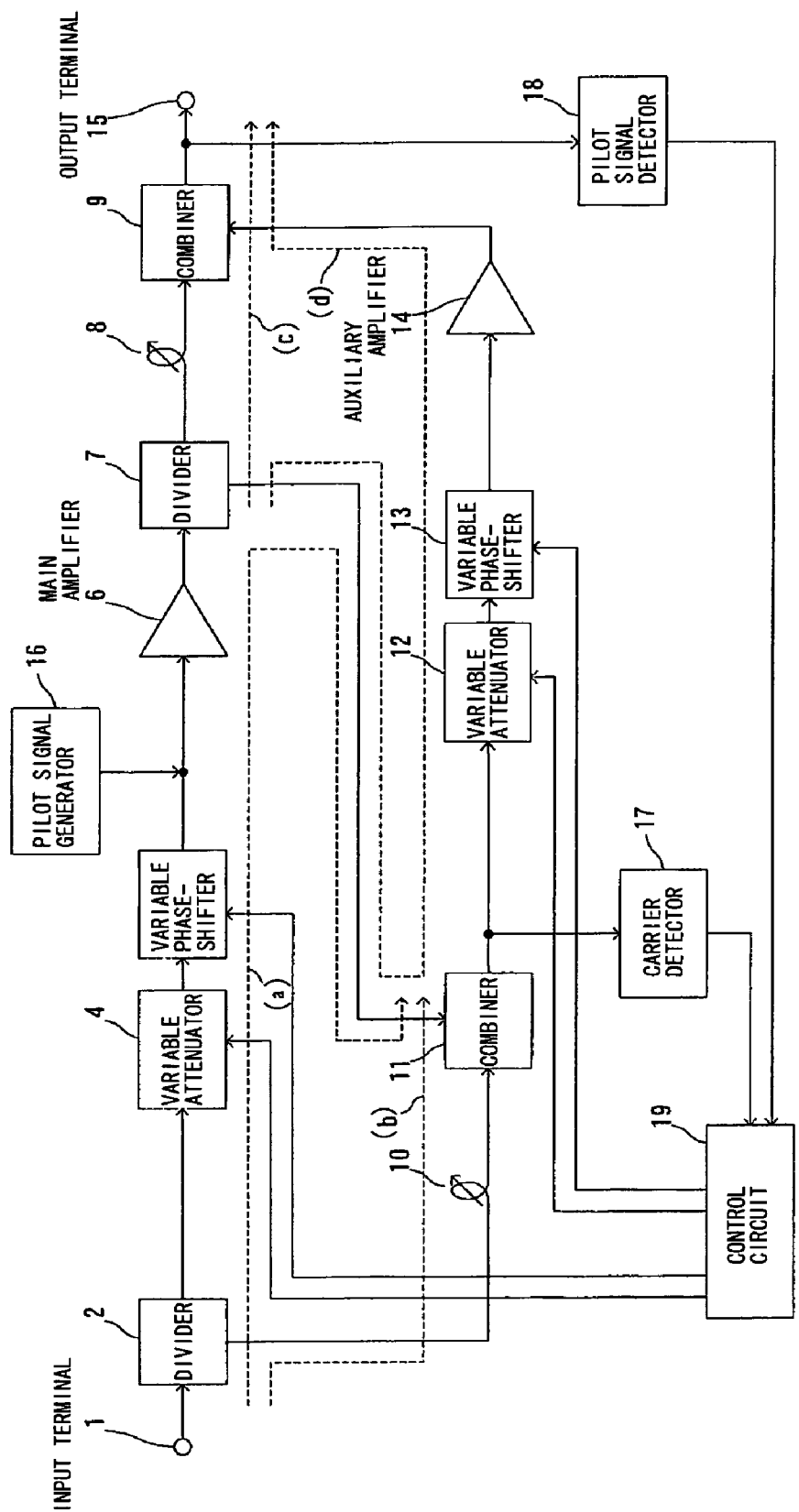
FIG. 2 is a circuit block diagram of a feed-forward amplifier of prior art 1.
Figure 3:
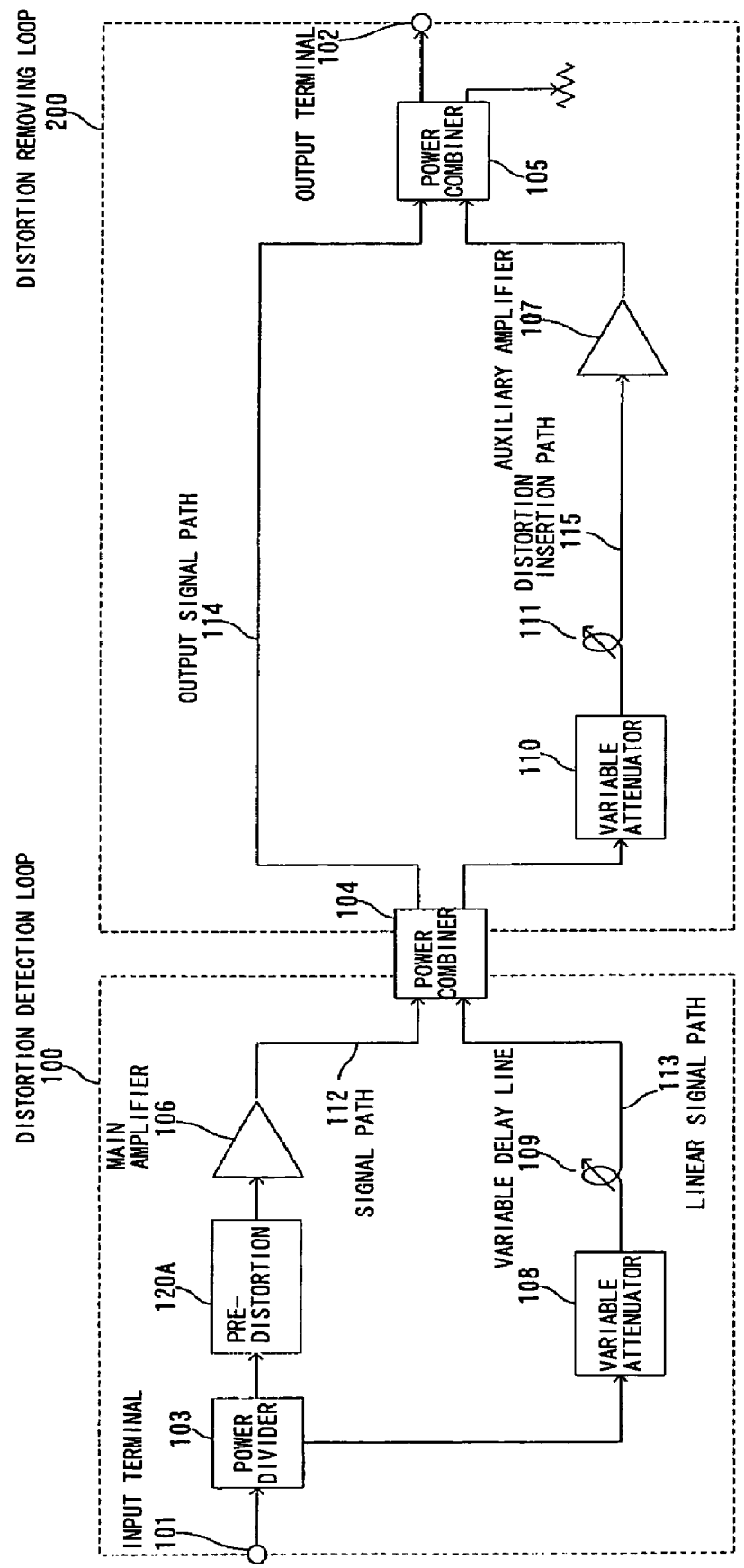
FIG. 3 is a circuit block diagram of a feed-forward amplifier of prior art 2.
Figure 4:
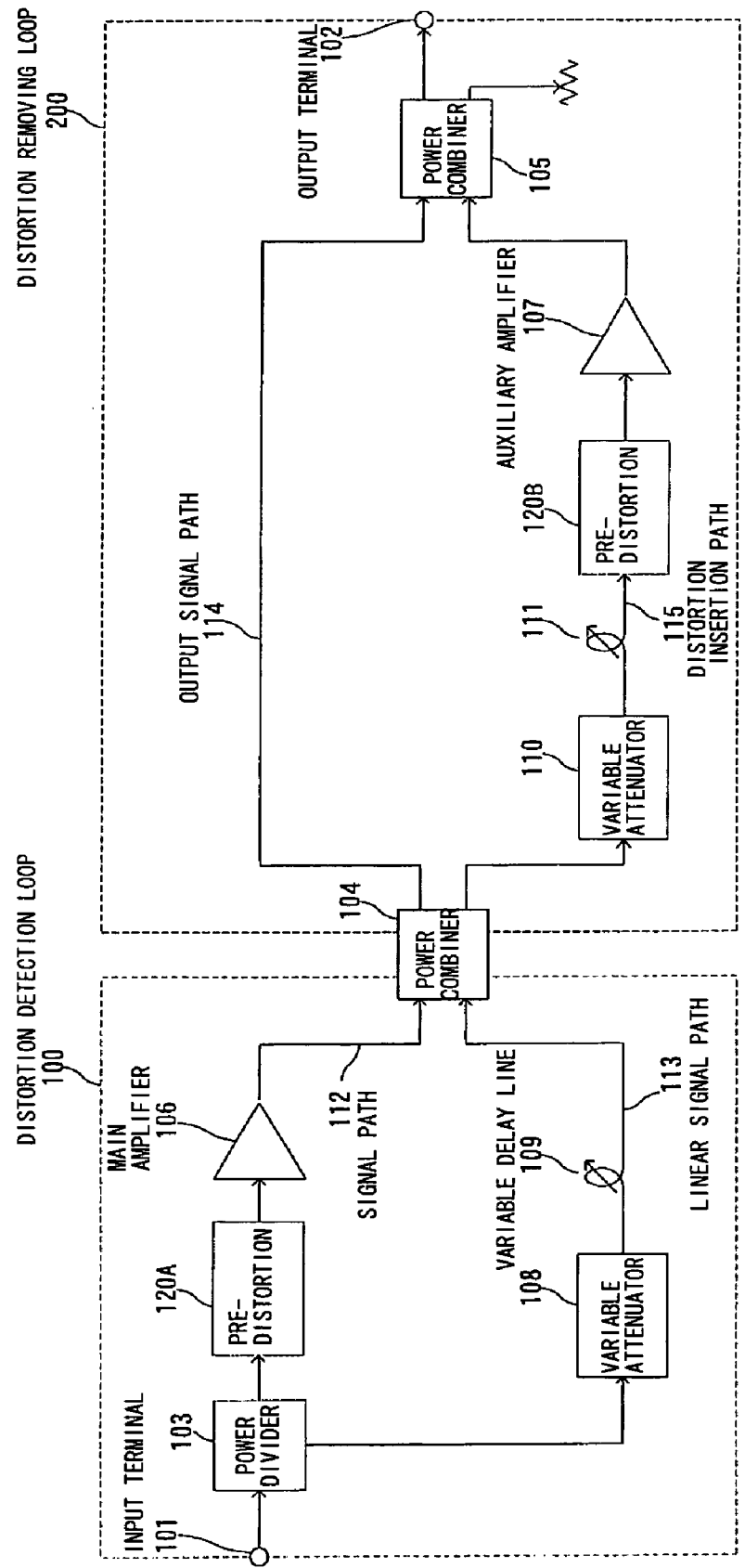
FIG. 4 is a circuit block diagram of a feed-forward amplifier of prior art 3.
Figure 5:
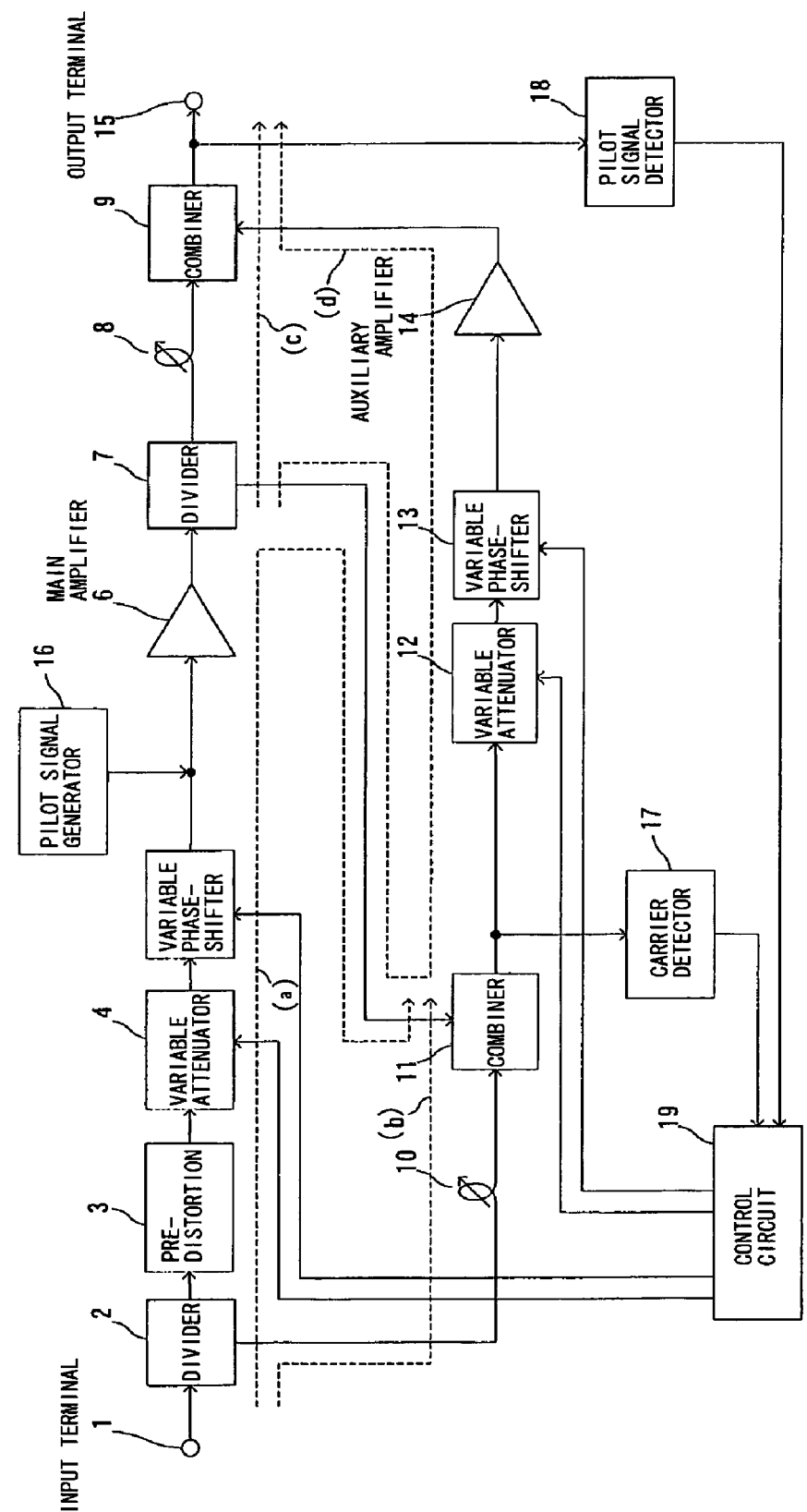
FIG. 5 is a circuit block diagram of a feed-forward amplifier of prior art 4.
Figure 6A:
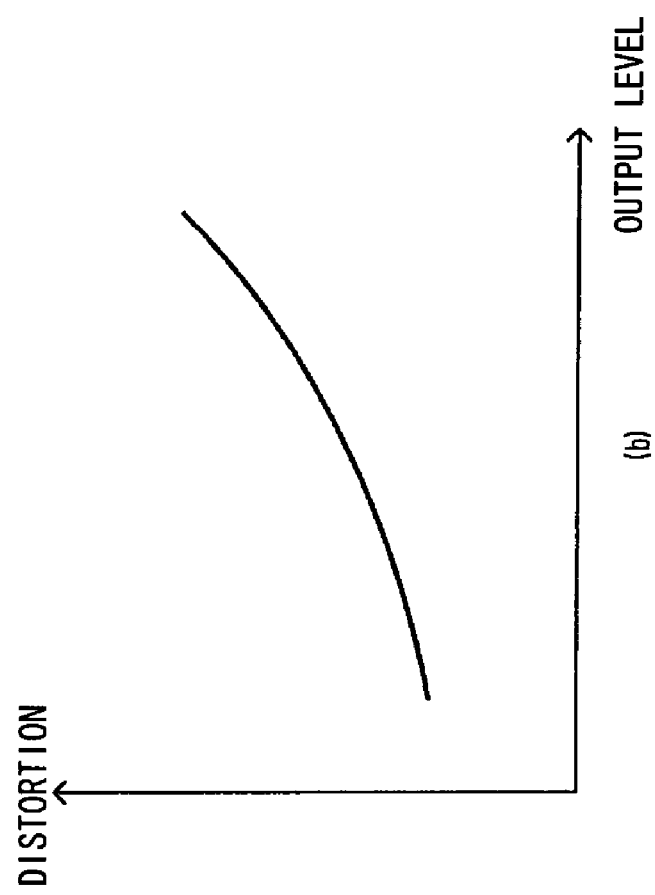
FIG. 6A shows the relationship between temperature and gain.
Figure 6B:
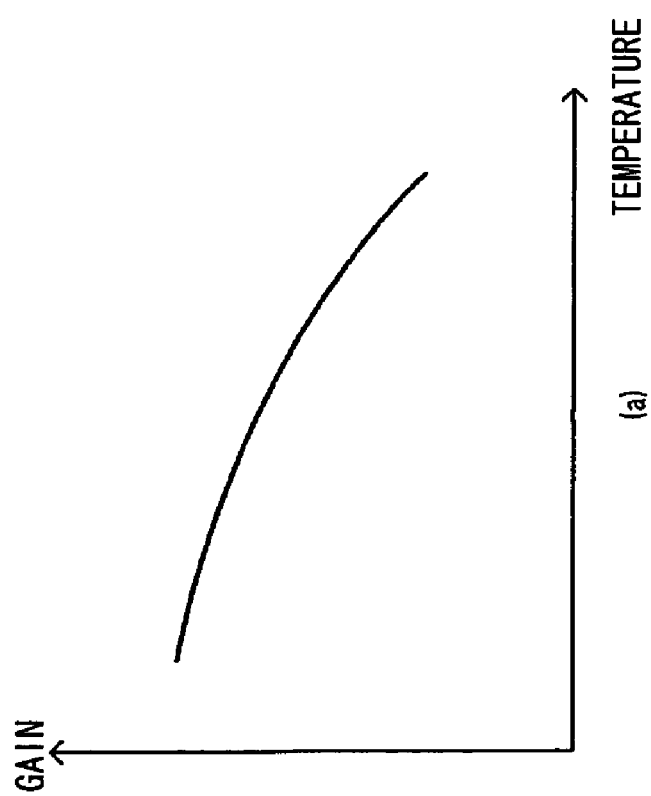
FIG. 6B shows the relationship between temperature and distortion.
Figure 7:
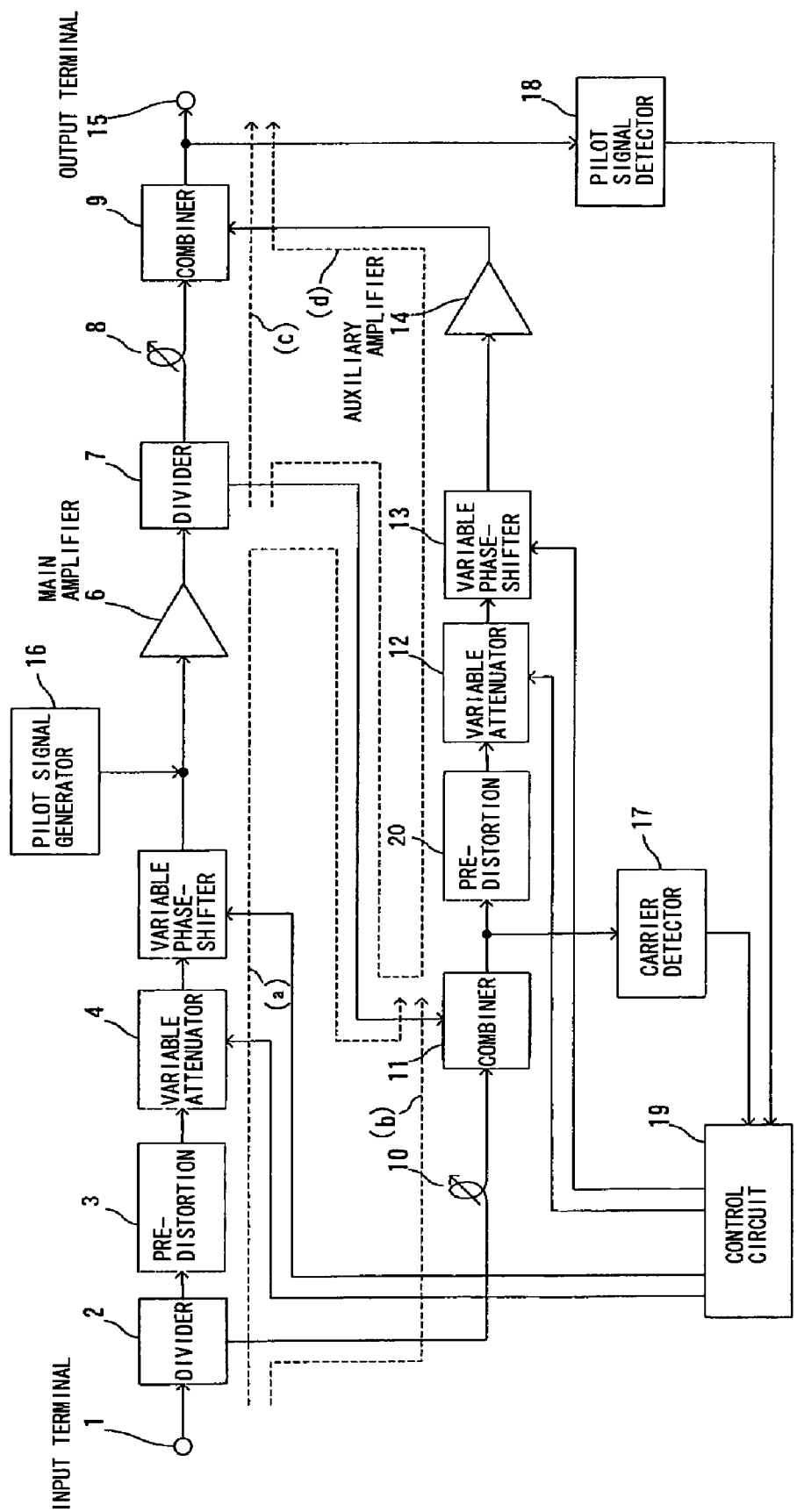
FIG. 7 is a circuit block diagram of a feed-forward amplifier of prior art 5.
Figure 8:
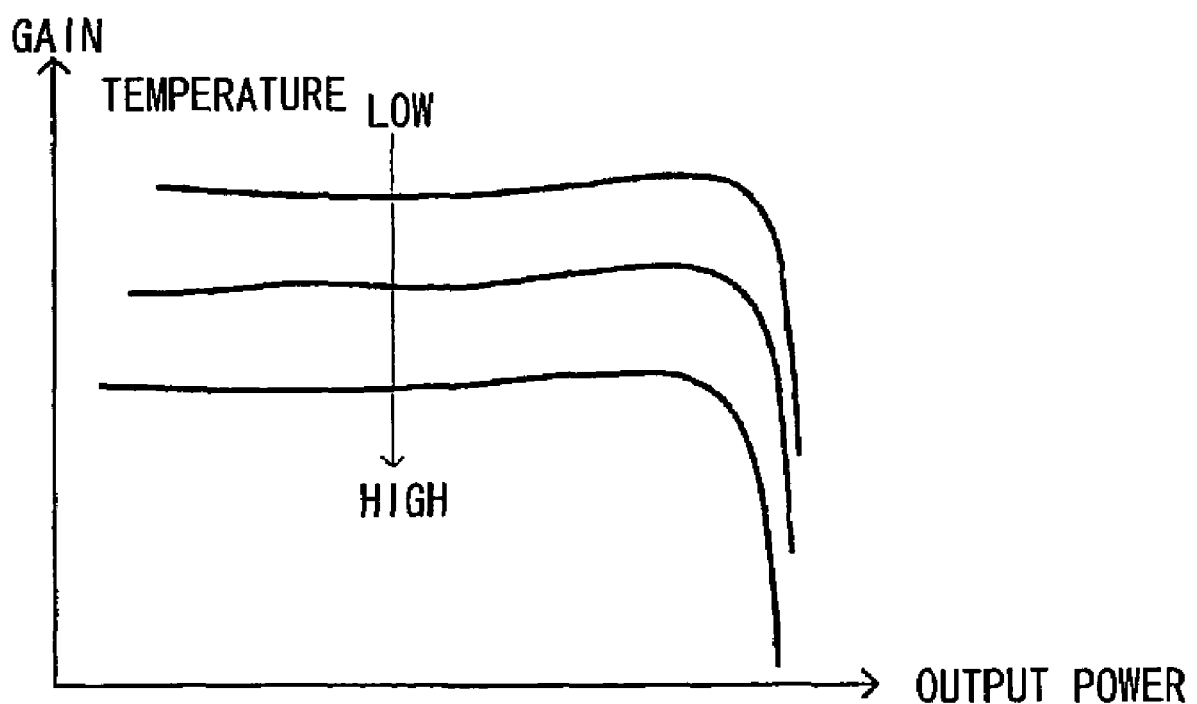
FIG. 8 is a graph showing examples of AM-AM characteristics with respect to the output power varying with the temperature of the amplifier.

The feed-forward amplifier according to the preferred embodiment of the present invention will be described with reference to FIG. 1. FIG. 1 is a circuit block diagram of the feed-forward amplifier according to the embodiment of the present invention.

As shown in FIG. 1, the feed-forward amplifier according to the embodiment of the present invention basically includes an input terminal 1, a divider 2, a variable phase-shifter 5, a variable attenuator 4, a predistortion circuit (predistortion compensator) 3, a variable attenuator 21, a main amplifier 6, a divider 7, a delay line 8, a combiner 9, an output terminal 15, a delay line 10, a combiner 11, a variable phase-shifter 13, a variable attenuator 12, a predistortion circuit 20, a variable attenuator 22, and an auxiliary amplifier 14. The feed-forward amplifier further includes a pilot signal generator 16 for inserting a pilot signal into the output of the predistortion circuit 3, a carrier detector 17 for detecting a carrier component from the output of the combiner 11, a pilot signal detector 18 for detecting a pilot signal from the output of the combiner 9, a control circuit 19 for controlling the variable phase-shifter 5, the variable attenuator 4, the variable phase-shifter 13, and the variable attenuator 12, a control circuit 23 for controlling the variable attenuators 21, 22, a temperature detector 24 for detecting temperature in the neighborhood of the main amplifier 6, and a temperature detector 25 for detecting temperature in the neighborhood of the auxiliary amplifier 14.

The divider 2, the variable phase-shifter 5, the variable attenuator 4, the predistortion circuit 3, the variable attenuator 21, the main amplifier 6, the divider 7, and the combiner 11 form a signal path (a). The divider 2, the delay line 10, and the combiner 11 form a signal path (b).

The divider 7, the delay line 8, the combiner 9, and the output terminal 15 form a signal path (c).

The divider 7, the combiner 11, the variable phase-shifter 13, the variable attenuator 12, the predistortion circuit 20, the variable attenuator 22, the auxiliary amplifier 14, the combiner 9, and the output terminal 15 form a signal path (d).

Each portion of the feed-forward amplifier will now be described.

A signal input from the input terminal 1 is divided by the divider 2 into the signal path (a) and the signal path (b). The signal output to the signal path (a) side passes through the variable phase-shifter 5, the variable attenuator 4, and the predistortion circuit 3. Then, after a pilot signal generated from the pilot signal generator 16 is inserted, the signal is input to the main amplifier 6 via the variable attenuator 21.

The predistortion circuit 3 is so set that the distortion of the main amplifier 6 is optimized.

The variable phase-shifter 5 and the variable attenuator 4 are controlled by the control circuit 19.

Further, the output of the main amplifier 6 is input to the divider 7 in such a manner that one divided output is input to the combiner 9 through the delay line 8 in the signal path (c) and the other divided output is input to the combiner 11 in the signal path (d).

The combiner 11 combines a signal that has passed through the delay line 10 in the signal path (b) with the output of the divider 7. The output of the combiner 11 is input to the auxiliary amplifier 14 via the variable phase-shifter 13, the variable attenuator 12, the predistortion circuit 20, and the variable attenuator 22 as the signal path (d).

The predistortion circuit 20 is so set that the distortion of the auxiliary amplifier 14 is optimized. The variable phase-shifter 13 and the variable attenuator 12 are controlled by the control circuit 19.

The output of the auxiliary amplifier 14 is combined by the combiner 9 with the signal that has passed through the delay line 8, and output from the output terminal 15.

A carrier component is detected by the carrier detector 17 at the output point of the combiner 11, and the detected carrier level is input to the control circuit 19.

Further, the pilot signal level inserted by the pilot signal detector 18 is detected at the output point of the combiner 9, and input to the control circuit 19.

Here, distortion detection means is implemented such that the signal divided by the divider 2 and delayed is combined by the combiner 11 with the signal divided by the divider 7.

Further, distortion removal means is implemented such that the output signal from the combiner 11 is combined by the combiner 9 with the delayed signal from the divider 7.

Next, the operation of the feed-forward amplifier will be described.

A temperature detection signal detected by the temperature detector 24 arranged in the vicinity of the main amplifier 6 is input to the control circuit 23.

The control circuit 23 prestores data (reference data) on gain and maximum output power of the main amplifier 6 with respect to temperature to control the variable attenuator 21 based on the input temperature detection signal and the reference data.

A specific control method is such that, if the gain of the main amplifier 6 at temperature T1 is G1, the maximum output power is P1, the amount of attenuation of the variable attenuator 21 is A1, the gain of the main amplifier 6 at temperature T2 is G2, the maximum output power is P2, and the amount of attenuation of the variable attenuator 21 is A2, the amount of attenuation A2 of the variable attenuator 21 is given by the following equation:

$$A2 = A1 - (G2 - G1) + (P2 - P1)$$

Further, since the level from the operating point of the predistortion circuit 3 to the start point of gain expansion, and the operating point of the main amplifier 6 do not change, if they are represented as $\alpha$ and Pout respectively, the start points $\beta1$, $\beta2$ of gain expansion at respective temperatures are given by the following equation:

$$\beta1 = Pout - G1 - A1 + \alpha$$
$$\beta2 = Pout - G2 - A2 + \alpha$$
$$= Pout - G1 - A1 + \alpha + (P2 - P1)$$
$$= \beta1 + (P2 - P1)$$

Here, since (P2−P1) denotes a change in the maximum output power of the main amplifier 6 with respect to a change in temperature, the above equation shows a temperature change between the start points of gain expansion performed by the predistortion circuit 3. Therefore, since the predistortion circuit 3 can be controlled according to the temperature change between the start points of gain expansion of the main amplifier 6, the optimum distortion compensation effect can be expected.

Like the case of the main amplifier 6, since temperature detected by the temperature detector 25 arranged in the vicinity of the auxiliary amplifier 14 is used to control the auxiliary amplifier 14 in the same manner as the main amplifier 6, the optimum distortion compensation effect can also be expected.

Note that the control circuit 19 controls the variable phase-shifter 5, the variable attenuator 4, the variable phase-shifter 13, and the variable attenuator 12 in the same manner as in the prior art 5.

According to the feed-forward amplifier, the variable attenuator 21 for preventing deterioration of distortion compensation according to a change in the ambient temperature of the main amplifier 6 is provided in addition to the variable attenuator 4 for optimally controlling the main amplifier 6 in the feed-forward amplifier. Further, the variable attenuator 22 for preventing deterioration of distortion compensation according to a change in the ambient temperature of the auxiliary amplifier 14 is provided in addition to the variable attenuator 12 for optimally controlling the auxiliary amplifier 14 in the feed-forward amplifier circuit. The control circuit 19 controls the variable attenuator 4 and the variable attenuator 12 to reduce the amount of attenuation according to the reduced amount of gain of the main amplifier 6 and the reduced amount of gain of the auxiliary amplifier 14. On the other hand, the control circuit 23 controls the variable attenuators 21, 22 to optimize the amount of attenuation according to changes in the ambient temperature of the main amplifier 6 and the ambient temperature of the auxiliary amplifier 14. This makes it possible to obtain sufficient distortion compensation effects of the predistortion circuit even if ambient temperature or the like changes.

The present invention is suitable for a feed-forward amplifier in which a predistortion circuit can have sufficient distortion compensation effects even if ambient temperature or the like changes.

What is claimed is:

1. A feed-forward amplifier including a main amplifier, a predistortion compensator provided in an input path of the main amplifier, distortion detection means for detecting a distortion component of the main amplifier, and distortion removal means for inserting the distortion component detected from the output of the main amplifier to remove distortion, the feed-forward amplifier comprising:
    a first variable attenuator and a first variable phase-shifter provided in an input path of the predistortion compensator;
    a second variable attenuator provided between the predistortion compensator and the main amplifier;
    first temperature detection means for detecting temperature in the neighborhood of the main amplifier;
    first control means for controlling the first variable attenuator and the first variable phase-shifter to minimize an input signal component contained in the distortion detected by the distortion detection means; and
    second control means for controlling the second variable attenuator so that the predistortion compensator minimizes the distortion of the main amplifier according to the temperature detected by the first temperature detection means.

2. The feed-forward amplifier according to claim 1, wherein
    the distortion removal means comprises an auxiliary amplifier for amplifying the detected distortion, a third variable attenuator provided in an input path of the auxiliary amplifier, a second variable phase-shifter, a second predistortion compensator, and a fourth variable attenuator,
    the feed-forward amplifier further comprises a combiner for combining the output of the auxiliary amplifier and the output of the main amplifier, and second temperature detection means for detecting temperature in the neighborhood of the auxiliary amplifier,
    the first control means controls the third variable attenuator and the second variable phase-shifter to minimize the detected distortion, and
    the second control means controls the fourth variable attenuator to have the second predistortion compensator minimize the distortion of the auxiliary amplifier according to the temperature detected by the second temperature detection means.

3. The feed-forward amplifier according to claim 1, wherein the second control means stores reference data on gain and maximum output power of the main amplifier with respect to temperature to control the second variable attenuator based on a temperature detection signal input from the first temperature detection means and the reference data.

4. The feed-forward amplifier according to claim 2, wherein the second control means stores reference data on gain and maximum output power of the auxiliary amplifier with respect to temperature to control the fourth variable attenuator based on a temperature detection signal input from the second temperature detection means and the reference data.

* * * * *